(12) United States Patent
Alshuhail et al.

(10) Patent No.: US 11,349,460 B1
(45) Date of Patent: May 31, 2022

(54) CURRENT-MODE SCHMITT TRIGGER USING CURRENT OUTPUT STAGES

(71) Applicants: SAUDI ARABIAN OIL COMPANY, Dhahran (SA); KING FAHD UNIVERSITY OF PETROLEUM & MINERALS, Dhahran (SA)

(72) Inventors: Abdulrahman Alshuhail, Dhahran (SA); Hussain Alzaher, Dhahran (SA); Alaa El-Din Hussein, Dhahran (SA)

(73) Assignees: SAUDI ARABIAN OIL COMPANY, Dhahran (SA); KING FAHD UNIVERSITY OF PETROLEUM & MINERALS, Dhahran (SA)

( * ) Notice: Subject to any disclaimer, the term of this patent is extended or adjusted under 35 U.S.C. 154(b) by 0 days.

(21) Appl. No.: 17/191,248

(22) Filed: Mar. 3, 2021

(51) Int. Cl.
| | |
|---|---|
| H03K 3/00 | (2006.01) |
| H03K 3/2897 | (2006.01) |
| G05F 1/56 | (2006.01) |
| H03F 3/45 | (2006.01) |
| G05F 3/26 | (2006.01) |
| H03K 5/24 | (2006.01) |

(52) U.S. Cl.
CPC ........... *H03K 3/2897* (2013.01); *G05F 1/561* (2013.01); *G05F 3/262* (2013.01); *H03F 3/45179* (2013.01); *H03K 5/24* (2013.01)

(58) Field of Classification Search
CPC .. H03K 3/3565; H03K 3/0377; H03K 5/2481; H03K 3/013; H03K 3/02337
USPC .................................................. 327/205–206
See application file for complete search history.

(56) References Cited

U.S. PATENT DOCUMENTS

| | | | |
|---|---|---|---|
| 3,984,703 | A | 10/1976 | Jorgensen |
| 4,063,119 | A | 12/1977 | Odell et al. |
| 4,359,649 | A | 11/1982 | Mundel |
| 4,490,627 | A | 12/1984 | Moench et al. |
| 4,571,504 | A | 2/1986 | Iwamoto et al. |
| 4,694,198 | A | 9/1987 | Umeki |
| 4,719,367 | A | 1/1988 | Denda |
| 4,883,975 | A | 11/1989 | Enomoto et al. |
| 5,327,020 | A | 7/1994 | Ikeda |

(Continued)

FOREIGN PATENT DOCUMENTS

| | | | |
|---|---|---|---|
| JP | H09321587 A | 12/1997 | |
| WO | WO-2009071640 A1 * | 6/2009 | ............... H03G 7/06 |
| WO | 2019028595 A1 | 2/2019 | |

OTHER PUBLICATIONS

Alzaher, Hussain A., "Novel Schmitt Trigger and Square-Wave Generator Using Single Current Amplifier", IEEE Access, Dec. 2019, vol. 7, pp. 186175-186181 (7 pages).

(Continued)

*Primary Examiner* — Quan Tra
(74) *Attorney, Agent, or Firm* — Osha Bergman Watanabe & Burton LLP

(57) ABSTRACT

A current-mode Schmitt Trigger includes a plurality of current output stages connected to a common supply voltage that powers the current-mode Schmitt Trigger, a main input on one of the current output stages that receives an input current, and a non-inverting output on a different one of the current output stages that is shorted to the main input to establish a positive closed-loop feedback and supplies a non-inverting output current as the input current. The current-mode Schmitt Trigger includes only active components.

20 Claims, 7 Drawing Sheets

(56) References Cited

U.S. PATENT DOCUMENTS

| | | | |
|---|---|---|---|
| 5,438,292 | A | 8/1995 | Tadokoro |
| 5,689,199 | A | 11/1997 | Erckert |
| 5,874,844 | A | 2/1999 | Shin |
| 6,825,735 | B2 | 11/2004 | Chung |
| 7,529,317 | B2 | 5/2009 | Chien et al. |
| 7,847,633 | B2 | 12/2010 | Kinget |
| 10,069,487 | B1* | 9/2018 | Kandala ............... H03K 3/3565 |
| 2015/0236699 | A1* | 8/2015 | Li .................. H03K 19/017509 |
| | | | 327/108 |
| 2019/0158072 | A1 | 5/2019 | Tornila Oliver |

OTHER PUBLICATIONS

Biolek, Dalibor and Viera Biolková, "Current-Mode CDTA-Based Comparators", in the 13th Electronic Devices and Systems 2006 IMAPS CS/SK International Conference, EDS2006, 2006, pp. 6-10 (5 pages).

Das, Rupam and Khushi Banerjee, "A Simple Current Mode Schmitt Trigger Circuit Based on Single CCDDCCTA without Employing Any Passive Components", International Journal of Innovative and Emerging Research in Engineering, vol. 3, Issue 8, 2016, pp. 17-21 (5 pages).

Das, Rupam et al., "Current Mode Schmitt Trigger Circuit Design Using Only Single CCCDTA", International Journal of Advanced Engineering and Management, vol. 2, No. 9, 2017, pp. 219-222 (4 pages).

Hirunporm, Jirawat and Montree Siripruchyanun, "An Independently/Electronically Controllable Schmitt Trigger Using only Single VDGA", 17th International Conference on Electrical Engineering/Electronics, Computer, Telecommunications and Information Technology, IEEE, 2020, pp. 118-121 (4 pages).

Kim, K. et al., "OTA-R Schmitt trigger with independently controllable threshold and output voltage levels", Electronics Letters, IEEE, vol. 13, No. 13, Jun. 1997, pp. 1103-1105 (3 pages).

Kumar, Atul and Bhartendu Chaturvedi, "Novel Electronically Controlled Current-Mode Schmitt Trigger Based on Single Active Element", International Journal of Electronics and Communications, Aug. 2017, doi: http://dx.doi.org/10.1016/j.aeue.2017.08.2017 (21 pages).

Lo, Yu-Kang et al., "Current-input OTRA Schmitt trigger with dual hysteresis modes", International Journal of Circuit Theory and Applications, Wiley Online Library, John Wiley & Sons, Ltd., vol. 38, Feb. 2009, pp. 739-746 (8 pages).

Mohammad, Umar et al., "A novel square wave generator based on the translinear circuit scheme of second generation current controlled current conveyor-CCCII", SN Applied Sciences, Springer Nature Switzerland AG, vol. 1, No. 587, May 2019 (14 pages).

Moradi, A. and M. Sawan, "Differential rail-to-rail voltage-controlled quadrature ring oscillator for low-power implantable transceivers", Electronics Letters, IEEE, vol. 50, No. 22, Oct. 2014, pp. 1568-1570 (2 pages).

Sedra, Adel S. et al., "17.4 Bistable Multivibrators", Microelectronic Circuits, 8th Edition, Oxford University Press, Nov. 2019, pp. 1355-1358 (4 pages).

Sedra, Adel S. et al., "17.5 Operation of the Astable Multivibrator", Microelectronic Circuits, 8th Edition, Oxford University Press, Nov. 2019, pp. 1364-1365 (3 pages).

Silapan, Phamom and Montree Siripruchyanun, "A Simple Current-mode Schmitt Trigger Employing Only Single MO-CTTA", 6th Annual International Conference on Electrical Engineering/Electronics, Computer, Telecommunications and Information Technology, IEEE, May 2009, pp. 556-559 (4 pages).

Soni, Gauri Shankar and Mohd. Samar Ansari, "Current-Mode Electronically-Tuneable Schmitt Trigger using Single 65nm ±0.75V CMOS CDTA", International Conference on Signal Propagation and Computer Technology, IEEE, 2014, pp. 137-141 (5 pages).

Tamnupan, Wuttipong and Varakorn Kasemsuwan, "A Low-Voltage Low-Power Current-Mode Differential Adjustable Schmitt Trigger", 9th International Conference on Electrical Engineering/Electronics, Computer, Telecommunications and Information Technology, IEEE, May 2012 (4 pages).

Zhang, Yudong et al., "A 0.35-0.5-V 18-152 MHz Digitally Controlled Relaxation Oscillator with Adaptive Threshold Calibration in 65-nm CMOS", IEEE Transactions on Circuits and Systems-II: Express Briefs, vol. 62, No. 8, Aug. 2015, pp. 736-740 (5 pages).

* cited by examiner

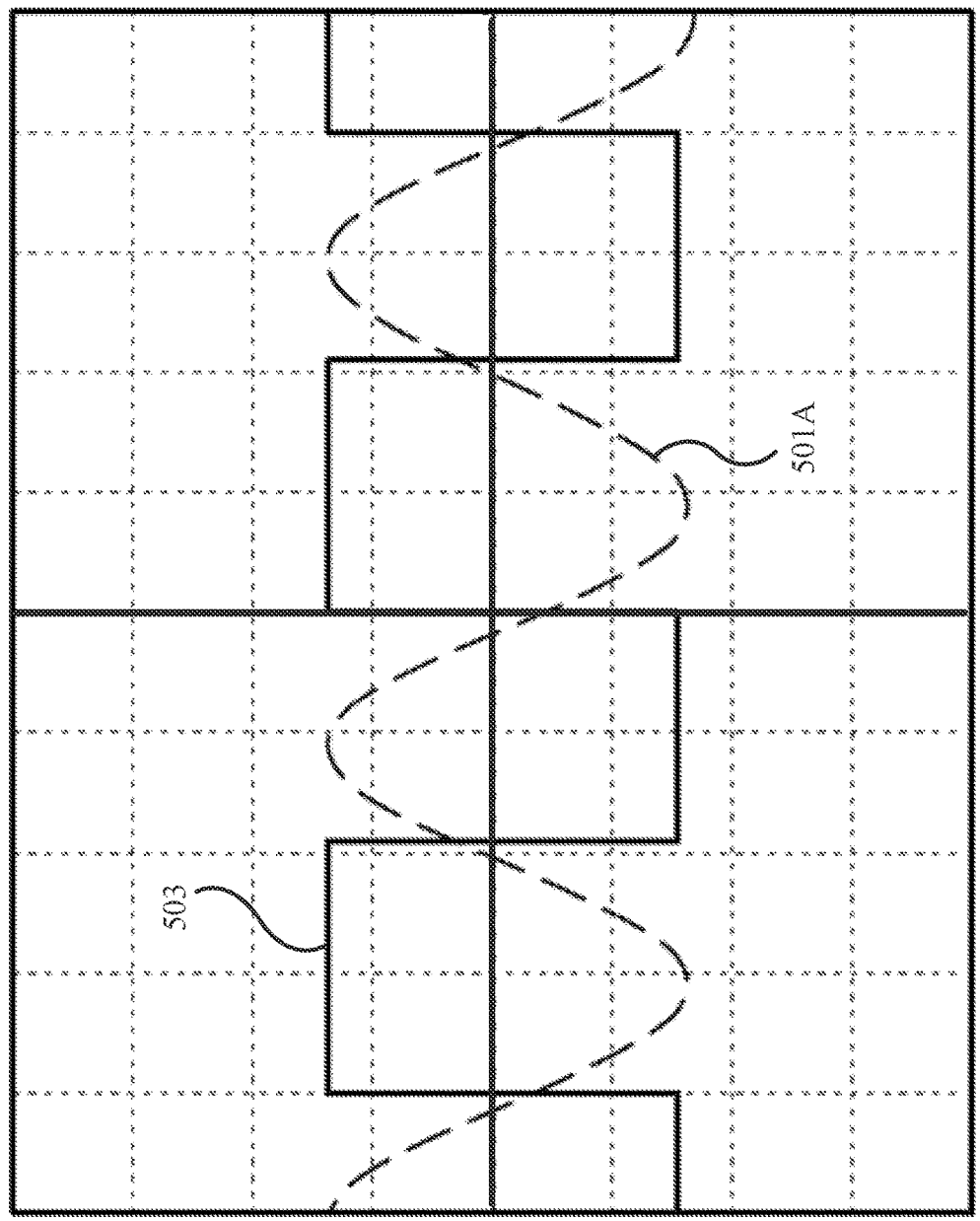

CURRENT-MODE SCHMITT TRIGGER USING CURRENT OUTPUT STAGES

BACKGROUND

Schmitt Triggers are essentially comparators with hysteresis. Schmitt Triggers have a wide range of applications such as: memory design, switching power supplies, pulse-width modulation, signal conditioning, and energy harvesting. Schmitt triggers are also basic building blocks for relaxation oscillators, which are essential for wireless systems and biomedical applications, and are frequently used for instrumentation and measurement. Schmitt Triggers can be used to control the operation of different blocks in integrated circuit applications such as biomedical, industrial, and environmental monitoring applications. The idea is to reduce a system's power consumption by operating the system and/or certain parts of the system in a pulsated manner rather than in a continuous mode.

Recently, current-mode Schmitt Triggers have become increasingly more popular over their voltage-mode counterparts that use operational amplifiers (opamp), operational transconductance amplifiers (OTA), operational transresistance amplifiers (OTRA), second-generation current conveyors (CCII), and current feedback operational amplifiers (CFOA). In particular, current-mode Schmitt Triggers provide simple circuit structure, low power consumption, high working frequency, high common mode rejection ratio (CMRR). Voltage-mode Schmitt Triggers also rely heavily on the supply voltage and transistor and/or amplifier parameters to control output amplitude and hysteresis making them less appealing for low power and low voltage applications.

Current-mode Schmitt Triggers using Current-Differencing Transconductance Amplifiers (CDTA), Complementary Metal-Oxide-Semiconductors (CMOS), or current amplifiers have outputs that are independent of the supply voltage and transistors parameters. However, conventional designs of these current-mode Schmitt Triggers suffer from high power consumption and are only able to provide a single output signal. Additionally, an amplitude of the output current is set to match the Schmitt Trigger's hysteresis value and thus cannot be independently controlled.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In general, one or more embodiments disclosed herein relate to a current-mode Schmitt Trigger including: a plurality of current output stages connected to a common supply voltage that powers the current-mode Schmitt Trigger; a main input on one of the current output stages that receives an input current; and a non-inverting output on a different one of the current output stages that is shorted to the main input to establish a positive closed-loop feedback and supplies a non-inverting output current as the input current. The current-mode Schmitt Trigger includes only active components.

In general, one or more embodiments disclosed herein relate to a current output stage (COS) of a current-mode Schmitt Trigger including multiple ones of the COS connected to a common supply voltage that powers the current-mode Schmitt Trigger. The COS includes: a plurality of complementary metal-oxide-semiconductors (CMOS); an input between at least gates of a first CMOS and a second CMOS among the plurality of CMOS s; a first output between a drain of the first CMOS and a drain of the second CMOS; and a second output between drains of a third CMOS and a fourth CMOS among the plurality of CMOSs.

Other aspects and advantages of the claimed subject matter will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

FIGS. 5A-5B show graphs in accordance with one or more embodiments.

DETAILED DESCRIPTION

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments disclosed herein provide a current-mode Schmitt Trigger utilizing complementary metal-oxide-semiconductor (CMOS) technology. The current-mode Schmitt Trigger of one or more embodiments includes at least three current output stages (COS). Each COS includes a biasing current and two complementary output signals (i.e., differential output signals). Such a configuration advantageously provides a Schmitt Trigger with transfer characteristics (e.g., output amplitude and hysteresis) that are independent of supply voltage and transistor parameters. The current-mode Schmitt Trigger of one or more embodiments also advantageously does not include any passive components (e.g., resistors), and operates in pure current mode making it suitable for low voltage operations. This also advantageously eliminates the need for using buffers to derive loads.

Figure 1:
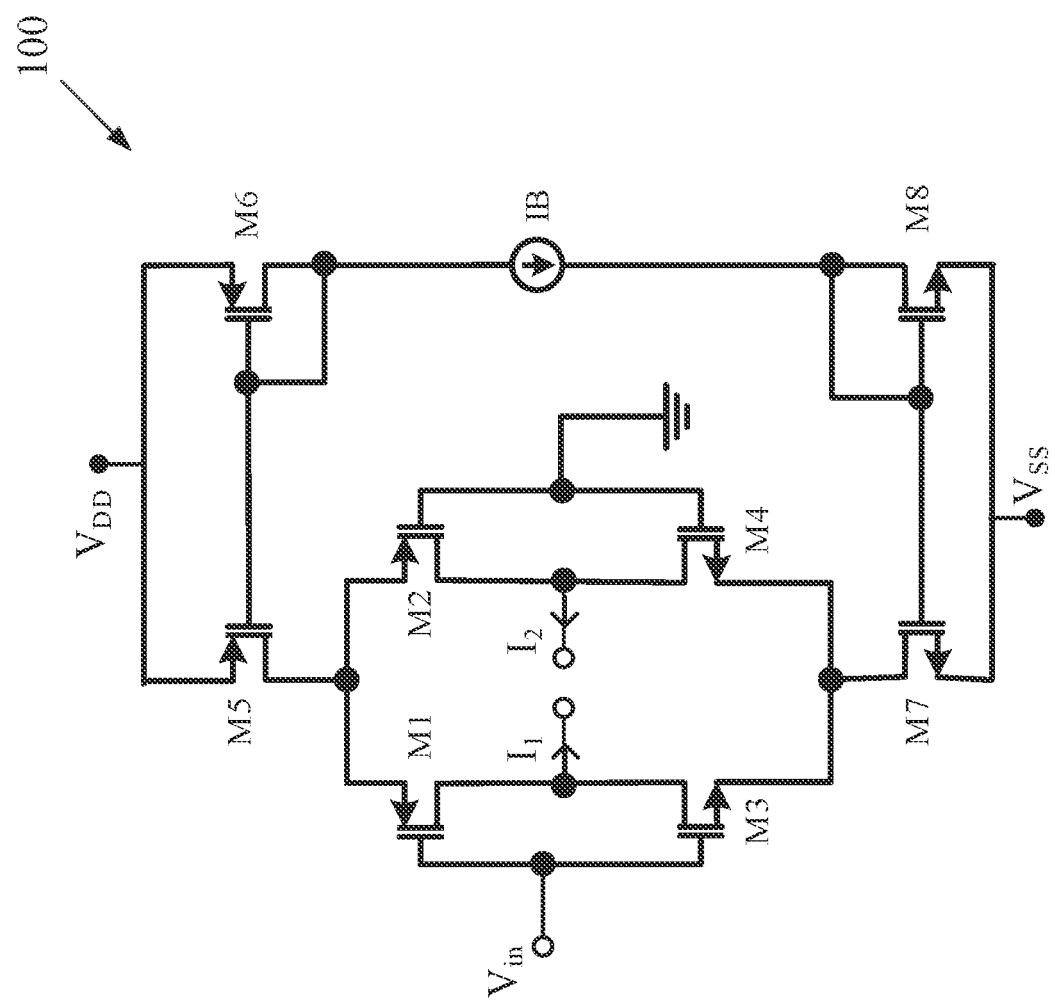
FIG. 1 shows a diagram in accordance with one or more embodiments.

FIG. 1 shows a single current output stage (COS) (100) of the current-mode Schmitt Trigger of one or more embodiments. As shown in FIG. 1, the COS (100) includes only active components (e.g., semiconductors and transistors) without any passive components (e.g., resistors). In particular, the COS (100) includes a plurality of CMOSs (M1-M8) powered by supply voltages (VDD, VSS). The plurality of CMOSs (M1-M8) includes four (4) P-channel CMOSs (M1, M2, M5, M6) and four (4) N-channel CMOSs (M3, M4, M7, M8).

One of ordinary skill in the art would appreciate that in the field of electronics, active components (e.g., transistors, CMOSs, rectifiers, amplifier, etc.) are parts (e.g., components) of a circuit that rely on an external power source to control or modify electrical signals. On the other hand, passive components (e.g., resistors, capacitors, transformers, diodes, etc.) are parts of a circuit that do not need an external power source to function.

As further shown in FIG. 1, the COS (100) includes an input (Vin) between the drains of CMOSs M1 and M3 while the drains of CMOSs M2 and M4 are connected to ground. The positive supply voltage (VDD) is supplied to the sources of CMOSs M5 and M6 while the negative supply voltage (VSS) is supplied to the sources of CMOSs M7 and M8. This configuration of the COS (100) generates two output current signals (herein referred to as "output current") ($I_1$ and $I_2$) when the input (Vin) is supplied with a voltage. The two output current signals ($I_1$, $I_2$) are differential signals where $I_1=-I_2$. In other words, independently, the COS (100) functions as a voltage-to-current convertor when the input (Vin) is supplied with a voltage.

In one or more embodiments, a biasing current ($I_B$) is generated between the drains of CMOSs M6 and M8 to cause the transistors to work within a pinch off region of the transistors. The COS (100) also has a high gain value (e.g., a gain of approximately 60 µA/V for a biasing current of 10 µA) when converting the input voltage supplied at the input ($V_{in}$) into the output currents ($I_1$, $I_2$). Additionally, the supply voltages (VDD and VSS) of the COS may be set within a range of ±0.5V to ±1.5V.

In one or more embodiments, a single COS (100) may be implemented using a CD4007UB CMOS dual complementary pair plus inverter integrated circuit (IC) chip. Each CD4007UB IC chip includes three (3) n-channel CMOSs and three (3) p-channel CMOSs. Additionally, any standard CMOSs and/or ICs housing standard CMOSs may be used to implement one COS (100).

Figure 2:
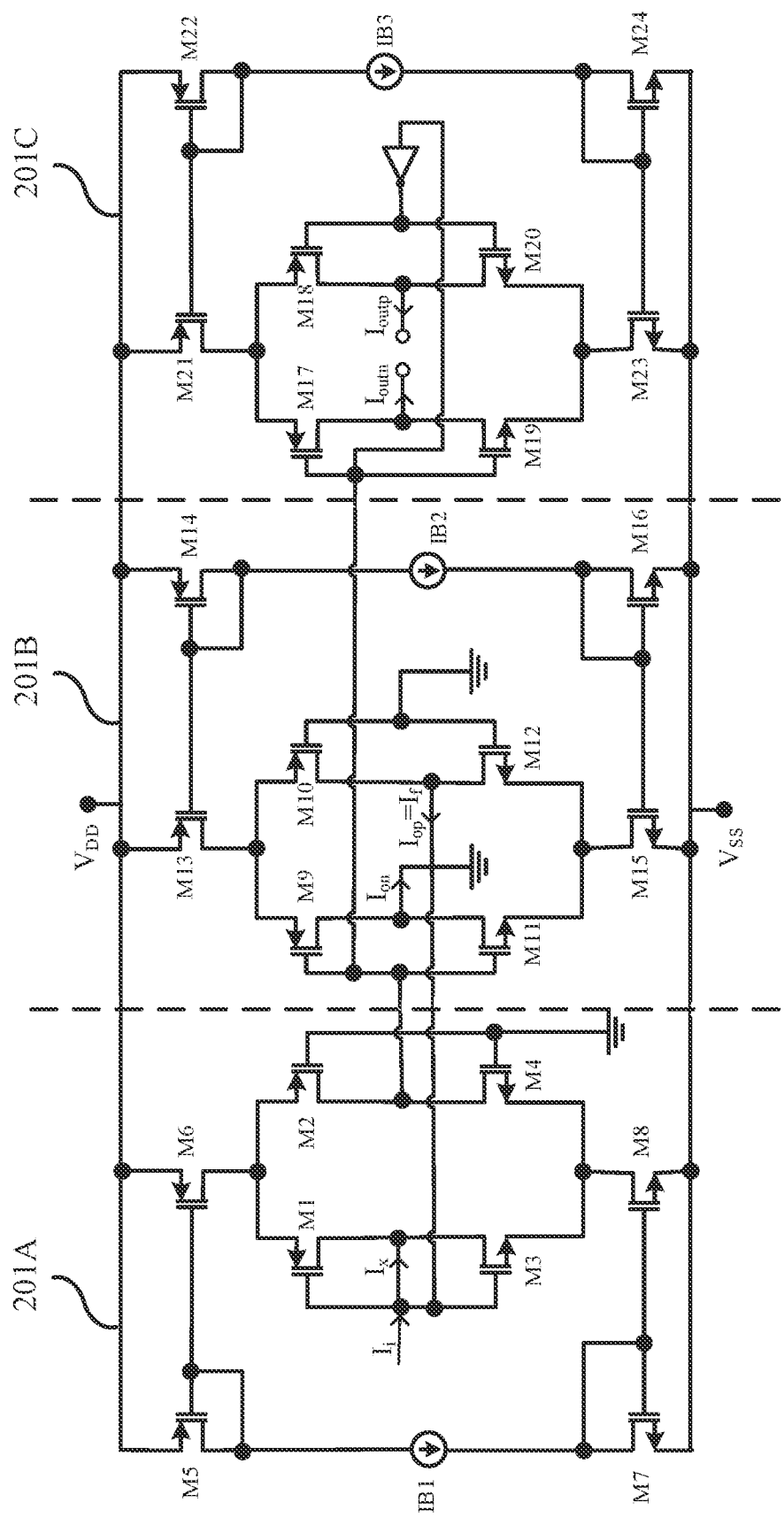
FIG. 2 shows a diagram in accordance with one or more embodiments.

FIG. 2 shows the current-based Schmitt Trigger (200) of one or more embodiments. As shown in FIG. 2, the current-based Schmitt Trigger (200) includes three (3) of the COS (100) shown in FIG. 1. Each of these COSs (201A, 201B, 201C) are connected to the same supply voltages (VDD and VSS). Each of these COSs (201A, 201B, 201C) also includes a respective biasing current ($I_{B1}$, $I_{B2}$, $I_{B3}$). Although the current-based Schmitt Trigger (200) in FIG. 2 is shown with three COSs (100), one of ordinary skill in the art would appreciate that more than three COSs (100) can be utilized to achieve the current-based Schmitt Trigger (200). Each of these COSs (201A, 201B, 201C) will now be discussed in more detail below.

In one or more embodiments, firstly, the COS (201A) will now be referred to as an input stage COS (201A). The input stage COS (201A) includes CMOSs M1-M8 and is configured as a high gain current-to-voltage convertor. That is, an input current signal is fed into input ($I_i$) to generate a large voltage signal (e.g., a gain of 3V/µA) between the drains of CMOSs M2 and M4 (i.e., to generate a high voltage signal at an output of the input stage COS (201A)).

In one or more embodiments, secondly, the COS (201B) will now be referred to as a hysteresis control COS (201B). The hysteresis control COS (201B) includes the CMOSs M9-M16 and is configured as a voltage-to-current convertor. The hysteresis control COS (201B) converts the voltage signal output from the input stage COS (201A) into balanced output signals ($I_{on}$ and $I_{op}$) where $I_{op}=-I_{on}$. In other words, $I_{op}$ is a non-inverting output current while $I_{on}$ is a complementary inverting output current.

A positive closed-loop feedback for the current-based Schmitt Trigger (200) is configured by shorting the non-inverting output ($I_{op}$) of the hysteresis control COS (201B) with the input ($I_i$) of the input stage COS (201A). This positive closed-loop feedback results in a feedback current ($I_f$) that flows in the direction of the input ($I_i$) of the input stage COS (201A). This positive closed-loop feedback also realizes (i.e., activates or forms) current-based Schmitt Trigger (200) circuit.

In one or more embodiments, thirdly, the COS (201C) will now be referred to as an output amplitude control COS (201C). The output amplitude control COS (201C) includes the CMOSs M17-M24 and, similar to the hysteresis control COS (201B), is configured as a voltage-to-current convertor. In particular, the output amplitude control COS (201C) converts the voltage signal output from the input stage COS (201A) into balanced output signals ($I_{outn}$ and $I_{outp}$) where $I_{outp}=-I_{outn}$. As seen in FIG. 2, to ensure that the output signals ($I_{outn}$ and $I_{outp}$) are fully balanced (i.e., fully identical), a digital inverter is connected between the gates of CMOSs M17 and M19 of the output amplitude control COS (201C). In one or more embodiments, the digital inverter may be a CMOS invertor consisting of a p-channel CMOS connected to a n-channel CMOS. In particular, the gates of the two CMOSs are connected and provided with an input voltage or current while the drains of the two CMOSs are connected and provide an output of the CMOS invertor. Finally, the source of the p-channel CMOS is connected to the positive supple voltage (VDD) while the source of the n-channel CMOS is connected to ground.

As further shown in FIG. 2, there is no feedback between the output amplitude control COS (201C) and the input stage COS (201A). Without such a feedback, the output amplitude control COS (201C) possess a large open-loop gain (e.g., an open-loop gain of 200A/A) as a result of the gains of the input stage COS (201A) and hysteresis control COS (201B). As a result, the output amplitude control COS (201C) becomes a current-mode comparator able to generate the balanced output signals ($I_{outn}$ and $I_{outp}$).

In one or more embodiments, a current from the drains of CMOSs M9 and M11 of the hysteresis control COS (201B) saturates at a negative DC biasing current of the hysteresis control COS (201B). This DC biasing current of the hysteresis control COS (201B) will now be referred to as a second biasing current ($I_{B2}$) of the current-mode Schmitt Trigger (200). In this configuration $I_{on}=-I_{B2}$ to result in a positive input current ($I_X$) at the input stage COS (201A). Conversely, a current from drains of CMOSs M10 and M12 of the hysteresis control COS (201B) saturates at a positive DC current of the hysteresis control COS (201B) (i.e., $I_{op}=I_{B2}$).

Similarly, a current from drains of CMOSs M17 and M19 of the output amplitude control COS (201C) saturates at a negative DC biasing current of the output amplitude control COS (201C). This DC biasing current of the output amplitude control COS (201C) will now be referred to as a third biasing current ($I_{B3}$) of the current-mode Schmitt Trigger (200). In this configuration $I_{outn}=-I_{B3}$. Conversely, a current from drains of CMOSs M18 and M20 of the output amplitude control COS (201C) saturates at a positive DC current of the output amplitude control COS (201C) (i.e., $I_{outp}=I_{B3}$).

Finally, the input stage COS (201A) also includes a DC biasing current, which will now be referred to a first biasing current ($I_B$) of the current-mode Schmitt Trigger (200). In one or more embodiments, changing the first biasing current ($I_B$) of the current-mode Schmitt Trigger (200) is not required to generate a large hysteresis (e.g., 100 µA) in the current-mode Schmitt Trigger (200).

Figure 3:
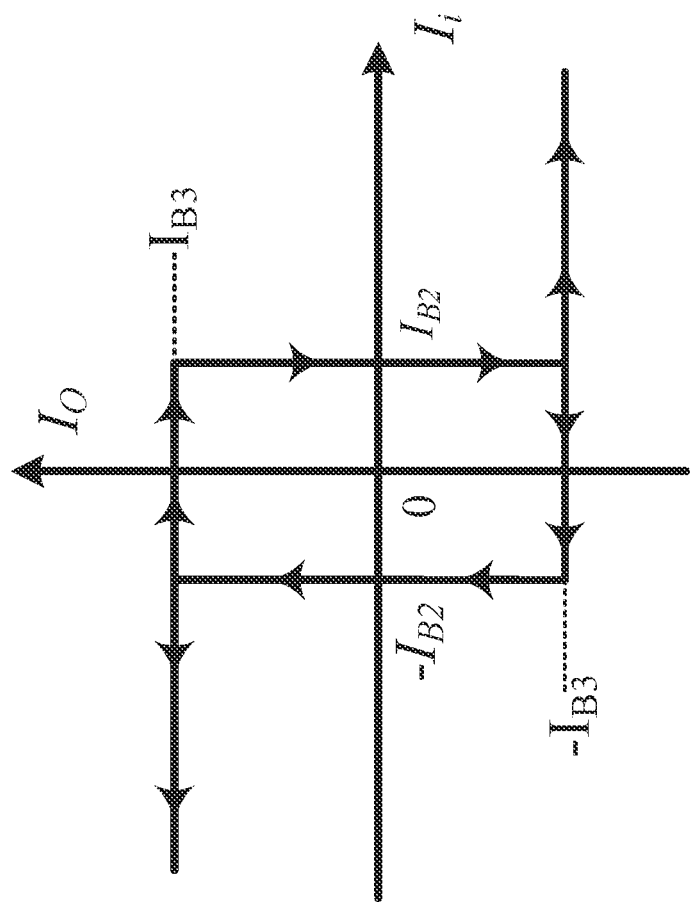
FIG. 3 shows a diagram in accordance with one or more embodiments.

An operation of the current-mode Schmitt Trigger (200) as a whole will now be discussed. In one or more embodiments, assuming that the current-mode Schmitt Trigger (200) starts at a high state of $I_{on}=I_{B2}$ (i.e., $I_{op}=-I_{B2}$ and $I_X<0$), a value of $I_{outn}$ will remain at $I_{B3}$ until $I_X$ becomes positive (i.e., $I_X$ becomes greater than $I_{B2}$). As $I_X$ becomes positive, the value of $I_{outn}$ will become $-I_{B3}$, which would result in $I_{outp}=I_{B3}$. Conversely, assuming that the current-mode Schmitt Trigger (200) starts at a low state of $I_{on}=-I_{B2}$ (i.e., $I_{op}=I_{B2}$ and $I_X>0$), the value of $I_{outn}$ will remain at $-I_{B3}$ until $I_X$ becomes negative (i.e., $I_X$ becomes less than $I_{B2}$). As $I_X$ becomes negative, the value of $I_{outn}$ will become $I_{B3}$, which would result in $I_{outp}=-I_{B3}$. The above operation results in the transfer characteristics of the Schmitt Trigger (200) shown in FIG. 3 showing a graph of the output current ($I_o$, also $I_{on}$) versus the input current ($I_i$).

As a result of the above operation, a hysteresis of the current-mode Schmitt Trigger (200) can be changed using only $I_{B2}$ while the balanced output signals ($I_{outn}$ and $I_{outp}$) of the output amplitude control COS (201C) can be independently controlled using only $I_{B3}$. During the above operation, $I_{B1}$ remains unchanged.

Figure 4A:
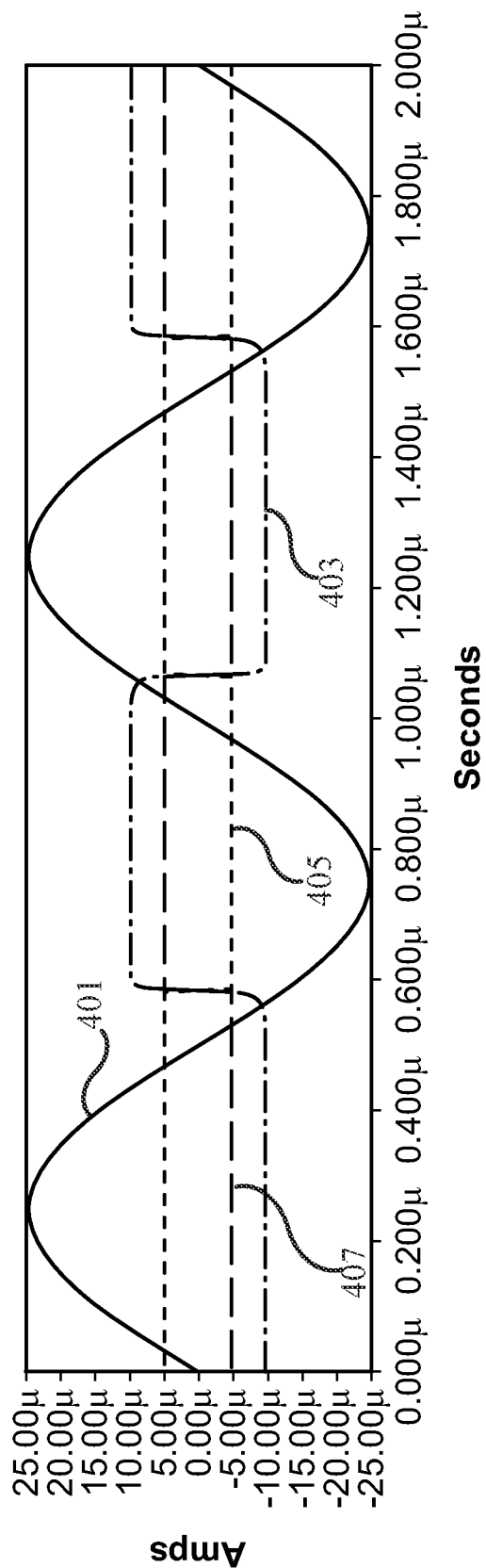
FIGS. 4A-4B show graphs in accordance with one or more embodiments.
Figure 4B:
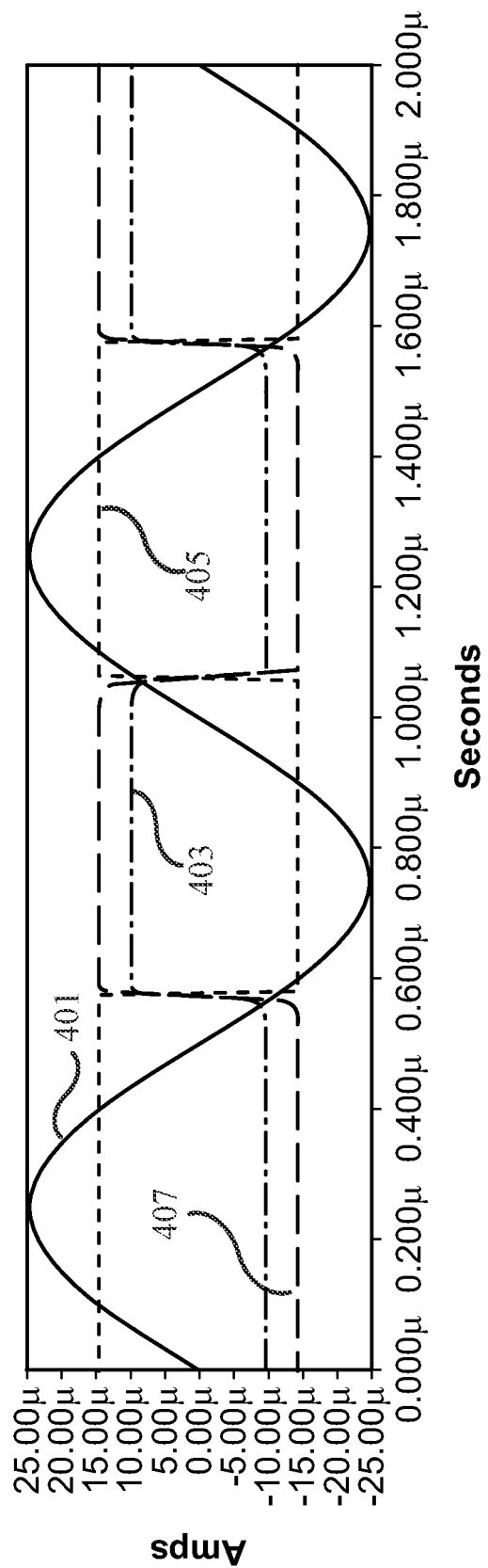

FIGS. 4A and 4B show implementation examples in accordance with one or more embodiments. In particular, in FIG. 4A, the current-mode Schmitt Trigger (100) is simulated using a 90 nm CMOST simulation process. During the simulation: a supply voltage of ±0.5V is set for $V_{DD}$ and $V_{SS}$; a sinusoidal signal (i.e., a sine wave) of 1 MHz is provided as the input signal ($I_i$) (401); the second biasing current ($I_{B2}$) (403) is set to 10 µA; and the third biasing current ($I_{B3}$) is set to 5 µA. In FIG. 4B, the third biasing current ($I_{B3}$) was adjusted to 15 µA.

As shown in FIGS. 4A and 4B, the current-mode Schmitt Trigger (200) switches the outputs $I_{outp}$ (405) and $I_{outn}$ (407) at the second biasing current ($I_{B2}$) (403) while the amplitudes of the outputs $I_{outp}$ (405) and $I_{outn}$ (407) are independently adjusted based on the value of the second biasing current ($I_{B2}$) (403). In particular, the amplitudes of the outputs $I_{outp}$ (405) and $I_{outn}$ (407) in FIG. 4A match the 5 µA set for the third biasing current ($I_{B3}$) while the amplitudes of the outputs $I_{outp}$ and $I_{outn}$ in FIG. 4B match the 15 µA set for the third biasing current ($I_{B3}$).

Figure 5B:
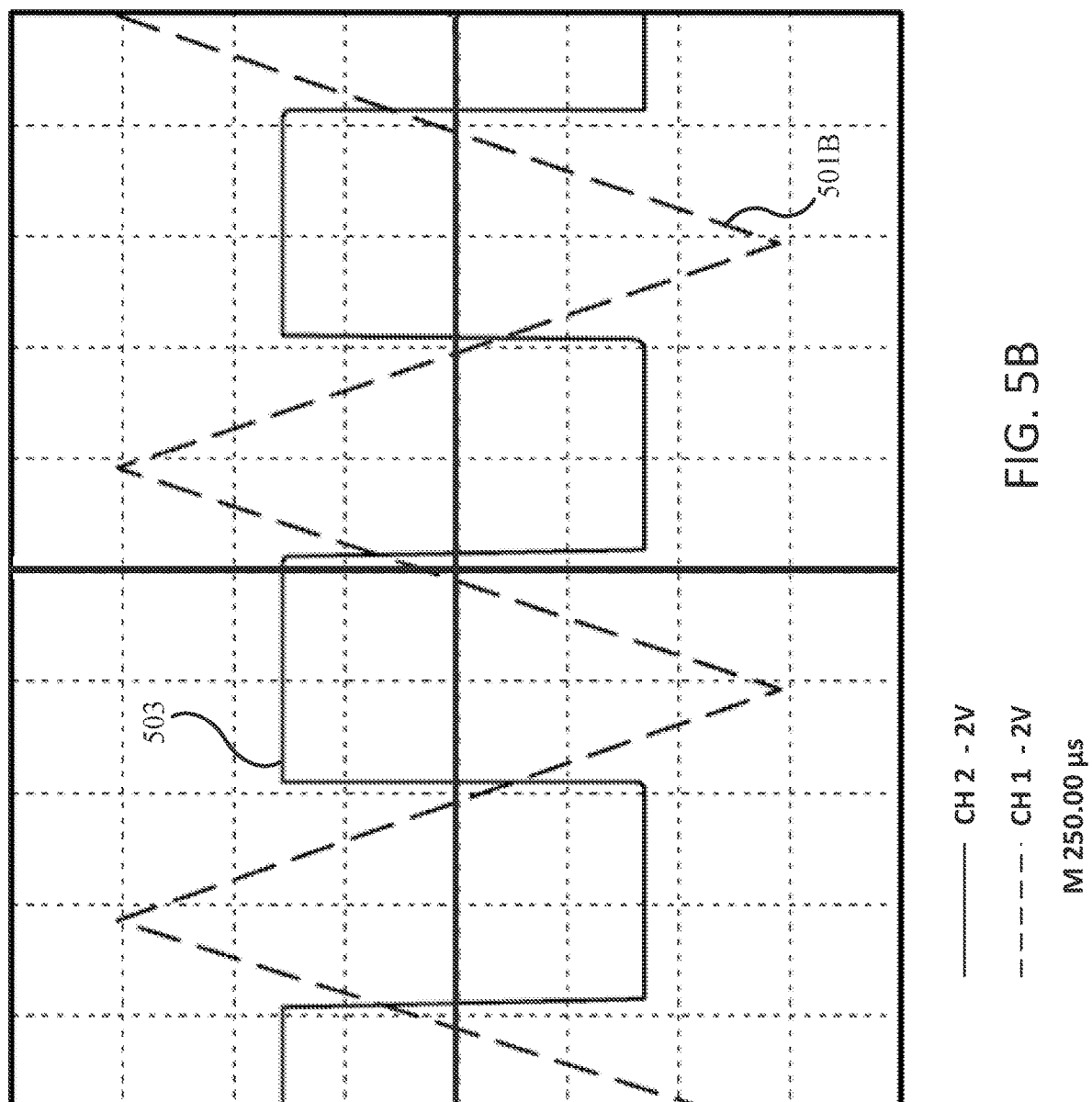

FIGS. 5A and 5B show another implementation example in accordance with one or more embodiments. In particular, in FIGS. 5A and 5B, the current-mode Schmitt Trigger (100) is implemented with supply voltages of ±3V and biasing currents $I_B=I_{B2}=I_{B3}=15$ µA. The input voltages in FIGS. 5A and 5B are converted to input currents where the amplitude of both the sinusoidal input signal (501A) in FIG. 5A and the triangular input signal (501B) in FIG. 5B is 50 µA. Both input signals (501A, 501B) have a frequency of 1 kHz. The output signals (503) are measured as voltages by multiplying the output current by a value of a load resistor. Converting the output voltages to current values yield expected output currents of ±15 µA (i.e., 30 µA peak-to-peak).

Embodiments of the present disclosure may provide at least one of the following advantages: the transfer characteristics (e.g., output amplitude and hysteresis) are independent of the supply voltage and transistor parameters; the current-mode Schmitt-Trigger (200) does not require any passive components (e.g., resistors); the current-mode Schmitt-Trigger (200) is able to produce two sets of differential output signals; the current-mode Schmitt-Trigger (200) is a pure current-mode circuit that makes it suitable for low voltage operation; the current-mode Schmitt-Trigger (200) does not require any buffers to derive loads; etc.

As one example, the current-based Schmitt Trigger (200) may be configured as a square wave generator used in Analog Digitizer Units (ADUs) for geophone systems that measure seismic data measurement in the oil and gas industry. In particular, the square wave output of the square wave generator may be used as clocks in the ADUs. Additionally, ADUs in geophone systems are known for their high power consumption, and low power ADUs are being designed to overcome the high power consumption requirement of these ADUs. The low voltage low power advantage of the square wave generator comprising the current-based Schmitt Trigger (200) of one or more embodiments enables the square wave generator to have good compatibility with new low power ADUs.

Furthermore, the current-based Schmitt Trigger (200) may be used in other types of signal conditioning circuits to control an operation of different blocks in the ADUs. This allows the geophone system (or part of the geophone system) to be operated in a pulsated manner rather than in a continuous mode, which advantageously reduces a power consumption of the geophone system.

While the disclosure has been described with respect to a limited number of embodiments, those skilled in the art, having benefit of this disclosure, will appreciate that other embodiments can be devised which do not depart from the scope of the disclosure as disclosed herein. Accordingly, the scope of the disclosure should be limited only by the attached claims.

Furthermore, although the preceding description has been described herein with reference to particular means, materials and embodiments, it is not intended to be limited to the particulars disclosed herein; rather, it extends to all functionally equivalent structures, methods and uses, such as are within the scope of the appended claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

What is claimed:
1. A current-mode Schmitt Trigger comprising:
   a plurality of current output stages connected to a common supply voltage that powers the current-mode Schmitt Trigger;
   a main input on one of the current output stages that receives an input current; and
   a non-inverting output on a different one of the current output stages that:

is shorted to the main input to establish a positive closed-loop feedback; and supplies a non-inverting output current as the input current, wherein the current-mode Schmitt Trigger includes only active components.

2. The current-mode Schmitt Trigger of claim 1, wherein at least two of the current output stages each comprises a pair of balanced output currents.

3. The current-mode Schmitt Trigger of claim 2, wherein the pair of balanced output currents comprises a non-inverting output current and an inverting output current with a same amplitude.

4. The current-mode Schmitt Trigger of claim 1, wherein the current output stages comprise:

an input stage that comprises the main input;

a hysteresis control stage that comprises the non-inverting output shorted to the main input; and an output amplitude control stage.

5. The current-mode Schmitt Trigger of claim 4, wherein the input stage is a current to voltage convertor that converts the input current into an output voltage, and the output voltage is fed into an input of the hysteresis control stage and an input of the output amplitude control stage.

6. The current-mode Schmitt Trigger of claim 4, wherein the hysteresis control stage:

comprises an inverting output with an amplitude equal to an amplitude of the non-inverting output; and generates a first biasing current, and the output amplitude control stage generates a second biasing current.

7. The current-mode Schmitt Trigger of claim 6, wherein transfer characteristics of the current-mode Schmitt Trigger are independent of the common supply voltage that powers that current-mode Schmitt Trigger.

8. The current-mode Schmitt Trigger of claim 7, wherein the transfer characteristics of the current-mode Schmitt Trigger are controlled by the first biasing current and the second biasing current.

9. The current-mode Schmitt Trigger of claim 1, wherein the current-mode Schmitt Trigger comprises only complementary metal-oxide-semiconductors (CMOS) as the active components.

10. The current-mode Schmitt Trigger of claim 4, wherein the output amplitude stage comprises:

a pair of balanced output currents comprising a non-inverting output current and an inverting output current;

a comparator that causes amplitudes of the pair of balanced output currents to match one another.

11. A current output stage (COS) of a current-mode Schmitt Trigger including multiple ones of the COS connected to a common supply voltage that powers the current-mode Schmitt Trigger, the COS comprising:

a plurality of complementary metal-oxide-semiconductors (CMOS) comprising an NMOS and a PMOS;

an input between a gate of the NMOS and the PMOS of at least one of a first CMOS and a second CMOS among the plurality of CMOSs;

a first output between a drain of the first CMOS and a drain of the second CMOS; and a second output between drains of a third CMOS and a fourth CMOS among the plurality of CMOSs, wherein the current-mode Schmitt Trigger comprises a main input on a first COS among multiple ones of the COS and a non-inverting output on a second COS among multiple ones of the COS, and the non-inverting output is shorted to the main input to establish a positive closed-loop feedback and supplies a non-inverting output current as the input current.

12. The COS of claim 11, wherein the COS includes only the plurality of CMOSs and no other components.

13. The COS of claim 11, further comprising:

the first output outputs a non-inverting current signal; and the second output outputs an inverting current signal.

14. The COS of claim 13, wherein the non-inverting current signal and inverting current signal have identical amplitudes and frequencies of oscillation.

15. The COS of claim 11, wherein the first CMOS and the third CMOS are n-channel CMOSs.

16. The COS of claim 11, wherein the second CMOS and the fourth CMOS are p-channel CMOS.

17. The COS of claim 11, wherein the COS receives an input voltage at the input and converts the input voltage into balanced current output signals.

18. The COS of claim 11, wherein the COS includes a biasing current that flows between drains of a fifth CMOS and a sixth CMOS among the plurality of CMOSs, the fifth CMOS is an n-channel CMOS, and the sixth CMOS is a p-channel CMOS.

19. The COS of claim 11, wherein the COS receives an input current at the input and converts the input current into balanced output voltages.

20. The COS of claim 11, wherein the COS operates as a current-to-voltage convertor when the input receives an input current and as a voltage-to-current convertor when the input receives an input voltage.

* * * * *